(12) United States Patent
Higashionji et al.

(10) Patent No.: US 7,834,523 B2
(45) Date of Patent: Nov. 16, 2010

(54) VIBRATION ACTUATOR

(75) Inventors: Masaru Higashionji, Osaka (JP); Hideaki Mukae, Hyogo (JP); Yusuke Adachi, Osaka (JP); Eiichi Nagaoka, Hyogo (JP)

(73) Assignee: Panasonic Corporation, Osaka (JP)

( * ) Notice: Subject to any disclaimer, the term of this patent is extended or adjusted under 35 U.S.C. 154(b) by 305 days.

(21) Appl. No.: 12/114,839

(22) Filed: May 5, 2008

(65) Prior Publication Data

US 2008/0278035 A1   Nov. 13, 2008

(30) Foreign Application Priority Data

May 7, 2007   (JP) ............... 2007-122571

(51) Int. Cl.
*H01L 41/053*   (2006.01)
(52) U.S. Cl. ............... 310/345; 310/323.02; 310/328
(58) Field of Classification Search ............ 310/323.02, 310/328, 345
See application file for complete search history.

(56) References Cited

U.S. PATENT DOCUMENTS

| | | | | |
|---|---|---|---|---|
| 6,057,633 A | * | 5/2000 | Inoi et al. ............... | 310/345 |
| 7,663,292 B2 | * | 2/2010 | Adachi ............... | 310/323.16 |
| 7,671,516 B2 | * | 3/2010 | Adachi et al. ............... | 310/348 |
| 7,679,265 B2 | * | 3/2010 | Higashionji et al. .... | 310/323.02 |
| 2005/0073217 A1 | * | 4/2005 | Sasaki et al. ............ | 310/323.09 |
| 2008/0278033 A1 | * | 11/2008 | Adachi et al. ............... | 310/317 |

FOREIGN PATENT DOCUMENTS

| | | |
|---|---|---|
| JP | 08-191575 | 7/1996 |
| JP | 2004-104984 | 4/2004 |

\* cited by examiner

*Primary Examiner*—Walter Benson
*Assistant Examiner*—Bryan P Gordon
(74) *Attorney, Agent, or Firm*—Renner, Otto, Boisselle & Sklar, LLP

(57) ABSTRACT

An ultrasonic actuator includes: an actuator body using a piezoelectric element and generating a plurality of vibrations of different vibration directions; a driver element provided in the actuator body and operated in accordance with the vibration of the actuator body to output a driving force in a predetermined driving direction; a case containing the actuator body; at least one support rubber provided between the actuator body and the case to elastically support the actuator body along the driving direction with respect to the case; and at least one stopper provided between the actuator body and the case which comes into contact with at least one of the actuator body and the case when the actuator body is displaced in a direction opposite the driving direction such that the displacement of the actuator body in the direction opposite the driving direction is limited.

18 Claims, 14 Drawing Sheets

# VIBRATION ACTUATOR

BACKGROUND OF THE INVENTION

1. Field of the Invention

The present invention relates to a vibration actuator including an actuator body using a piezoelectric element and generating a plurality of vibrations of different vibration directions.

2. Description of Related Art

A vibration actuator including an actuator body using a piezoelectric element has been known (cf., Japanese Unexamined Patent Publication No. 8-191575) and used in ultrasonic motors and devices which make small step-by-step displacement.

The actuator body includes the piezoelectric element and generates a plurality of vibrations including longitudinal and bending vibrations in harmony by vibrating the piezoelectric element. The actuator body is elastically supported in a direction toward a movable body and a driver element of the actuator body is in contact with the movable body with pressure applied thereto. That is, when the actuator body generates the longitudinal and bending vibrations in harmony, a driving force is transmitted to the movable body through the driver element and the movable body moves in a certain moving direction.

SUMMARY OF THE INVENTION

Although the vibration actuator of Japanese Unexamined Patent Publication No. 8-191575 is elastically supported only in the direction toward the movable body, it is inelastically supported in one of driving directions in which the driver element outputs the driving force. As a result, the vibration of the actuator body in the driving direction is hindered and the efficiency of the vibration actuator may be reduced.

Therefore, supporting the actuator body elastically along the driving direction is considered as a solution to this problem. With this configuration, the actuator body is supported without hindering the vibration of the actuator body in the driving direction.

When the driving force is transmitted from the actuator body to the movable body in the driving direction through the driver element, the actuator body receives a reaction force from the movable body. For example, when the movable body is moved in one of the driving directions, the actuator body receives the reaction force in the direction opposite the driving direction. When a driving load is small, the reaction force is also small. Therefore, even if the actuator body is elastically supported along the driving direction, an elastic support can receive the reaction force and a sufficient driving force is applied to the movable body. On the other hand, if the driving load is large, the reaction force also becomes large. Therefore, the reaction force cannot be received by the elastic support and the driving force is not output appropriately to the movable body. That is, the vibration displacement of the actuator body is not output as the driving force, but consumed to elastically deform an elastic support of the actuator body.

That is, when the actuator body is elastically supported along the driving direction, the driving force of the actuator body is transmitted to the movable body while the elastic force of the elastic support and the reaction force of the moving body are kept in balance. Therefore, the magnitude of the driving force is limited.

The present invention has been achieved in view of the above-described problem. An object of the invention is to realize a structure for supporting an actuator body which does not hinder the vibration of the actuator body in the driving direction and makes it possible to output a sufficient driving force even if a large reaction force is exerted on the driver element.

A vibration actuator of the present invention includes: an actuator body using a piezoelectric element and generating a plurality of vibrations of different vibration directions; a driver element provided in the actuator body and operated in accordance with the vibration of the actuator body to output a driving force in one of predetermined driving directions; a case for containing the actuator body; at least one elastic support provided between the actuator body and the case to elastically support the actuator body along the driving direction with respect to the case; and at least one abutment provided between the actuator body and the case to be able to come into contact with at least one of the actuator body and the case when the actuator body is displaced in a direction opposite the driving direction such that the displacement of the actuator body in the direction opposite the driving direction is limited.

According to the present invention, the elastic support is provided to elastically support the actuator body along the driving direction and the abutment is provided to limit the displacement of the actuator body in the direction opposite the driving direction. Therefore, the actuator body is elastically supported by the elastic support without hindering the vibration thereof. Even if the reaction force exerted by a counterpart to which the driver element applies the driving force is large, the reaction force is received by the abutment such that the driving force of the actuator body is surely transmitted to the counterpart.

BRIEF DESCRIPTION OF THE DRAWINGS

FIG. 12A shows the stage not driven yet, FIG. 12B shows the stage driven by one of driver elements as the actuator body stretches in the lengthwise direction and FIG. 12C shows the stage driven by the other driver element as the actuator body contracts in the lengthwise direction.

DETAILED DESCRIPTION OF THE INVENTION

Hereinafter, an embodiment of the present invention will be described with reference to the drawings.

Figure 1:
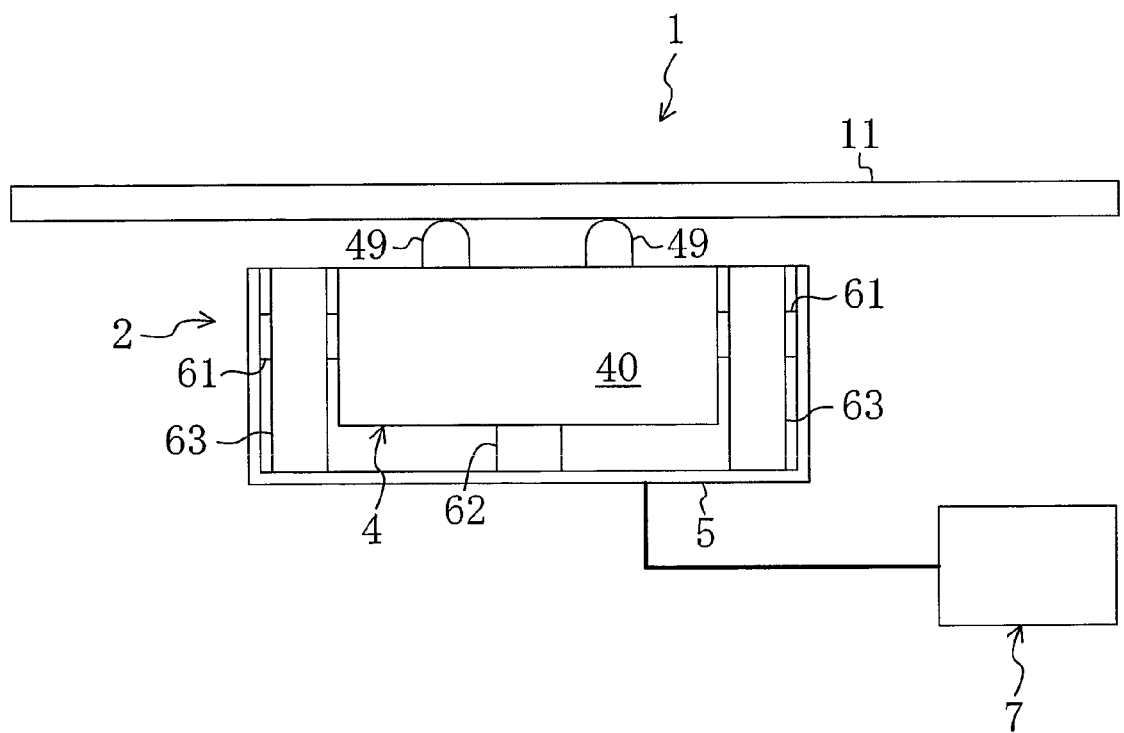
FIG. 1 is a schematic front view illustrating the schematic structure of an ultrasonic actuator according to an embodiment of the present invention.
Figure 2:
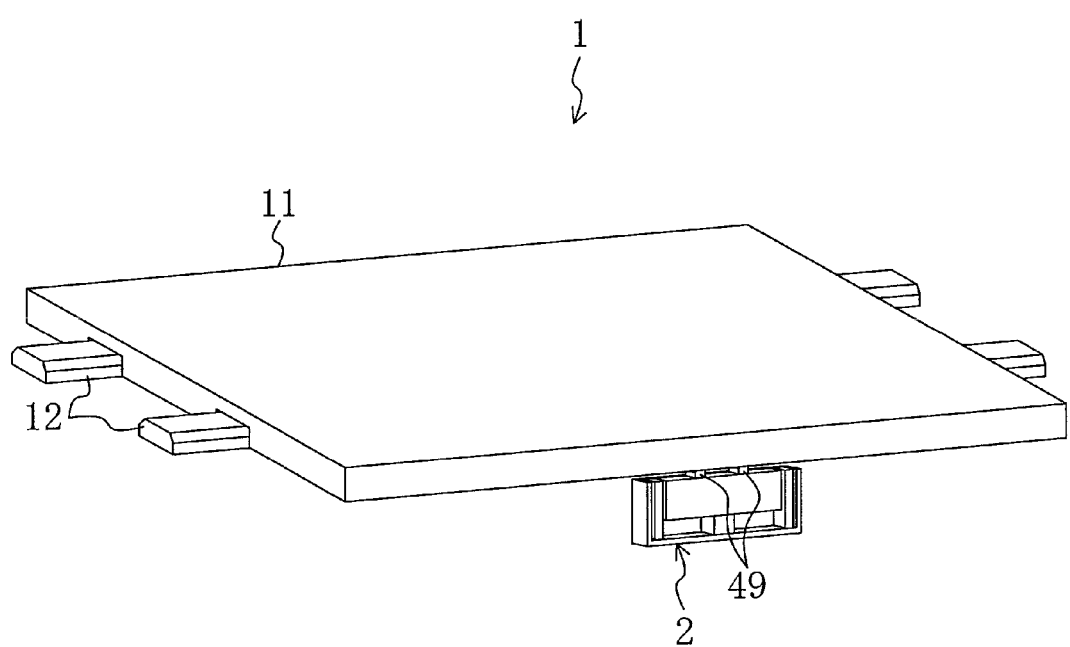
FIG. 2 is a perspective view of a drive unit.

A drive unit 1 according to an embodiment of the invention includes, as shown in FIGS. 1 and 2, a stage 11, an ultrasonic actuator 2 and a control unit 7 for controlling and driving the ultrasonic actuator 2.

The stage 11 is slidably attached to guides 12 fixed in parallel with each other to a base (not shown) as a stationary body. That is, the stage 11 is movable in the extending direction of the guides 12 (the extending direction of the guides 12 is the moving direction of the stage 11). The stage 11 is a plate-like member and substantially square-shaped when viewed in plan. The ultrasonic actuator 2 is arranged such that driver elements 49 described later come into contact with the rear surface of the stage 11 (the surface on which the guides 12 are provided).

Figure 3:
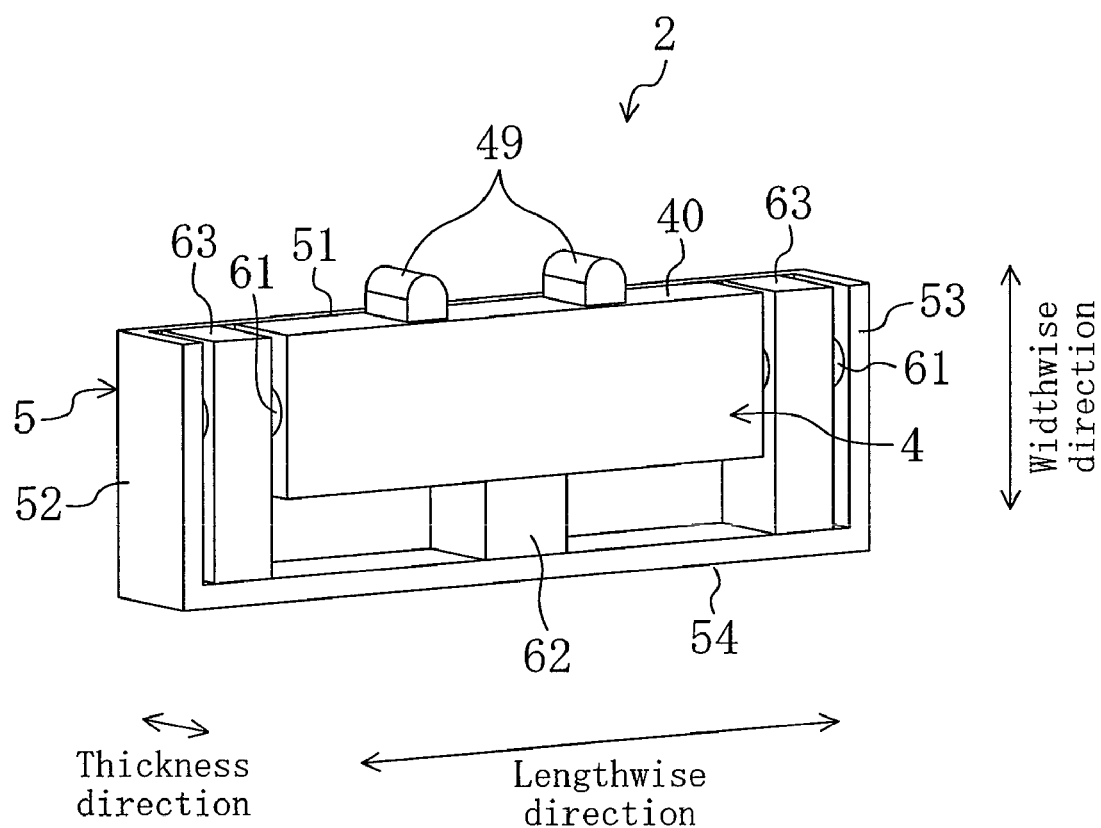
FIG. 3 is a perspective view of the ultrasonic actuator.

The ultrasonic actuator 2 includes, as shown in FIG. 3, an actuator body 4 which generates vibration, driver elements 49 for transmitting the driving force of the actuator body 4 to the stage 11, a case 5 for containing the actuator body 4, support rubbers 61 interposed between the actuator body 4 and the case 5 to elastically support the actuator body 4, a bias rubber 62 for biasing the actuator body 4 to the stage 11 and stoppers 63 interposed between the actuator body 4 and the case 5 to limit the displacement of the actuator body 4. The ultrasonic actuator 2 functions as a vibration actuator.

The actuator body 4 comprises a piezoelectric element unit 40.

The piezoelectric element unit 40 is substantially in the form of a rectangular parallelepiped and has a pair of substantially rectangular principle surfaces facing each other, a pair of long side surfaces facing each other and extending in the lengthwise direction of the principle surfaces to be orthogonal to the principle surfaces and a pair of short side surfaces facing each other and extending in the widthwise direction of the principle surfaces to be orthogonal to both of the principle surfaces and the long side surfaces.

Figure 4:
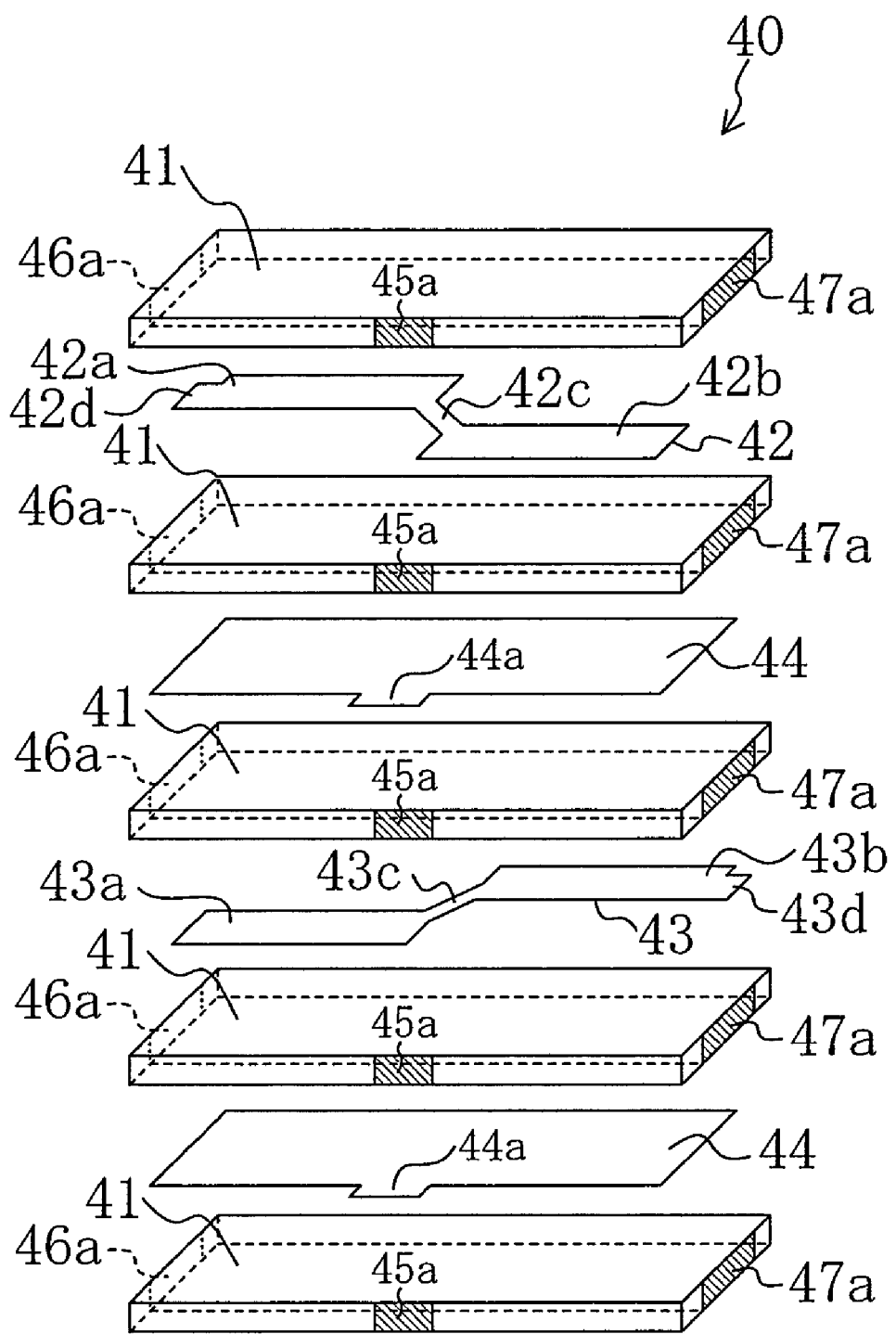
FIG. 4 is an exploded perspective view of a piezoelectric element unit.

As shown in FIG. 4, the piezoelectric element unit 40 is provided by alternately stacking five piezoelectric layers (piezoelectric elements) 41 and four internal electrode layers 42, 44, 43 and 44. Specifically, the internal electrode layers 42, 44, 43 and 44 are a first feeding electrode layer 42, a common electrode layer 44, a second feeding electrode layer 43 and a common electrode layer 44 stacked in this order alternately with the piezoelectric layers 41. The first feeding electrode layer 42, the second feeding electrode layer 43 and the common electrode layers 44 are printed on the principle surfaces of the piezoelectric layers 41, respectively.

Each of the piezoelectric layers 41 is an insulating layer made of ceramic such as lead zirconate titanate. Just like the piezoelectric element unit 40, the piezoelectric layer 41 is substantially in the form of a rectangular parallelepiped and has a pair of principle surfaces, a pair of long side surfaces and a pair of short side surfaces. Each of the piezoelectric layers 41 is provided with an external electrode 45*a* formed in the middle of one of the long side surfaces in the lengthwise direction, an external electrode 46*a* formed in the middle of one of the short side surfaces in the widthwise direction and an external electrode 47*a* formed in the middle of the other short side surface in the widthwise direction.

Each of the common electrode layers 44 is substantially rectangular and covers almost all the principle surface of the piezoelectric layer 41. The common electrode layer 44 has a lead electrode 44*a* extending from the middle of one of the long sides of the common electrode layer 44 in the lengthwise direction to the external electrode 45*a* of the piezoelectric layer 41.

Figure 5:
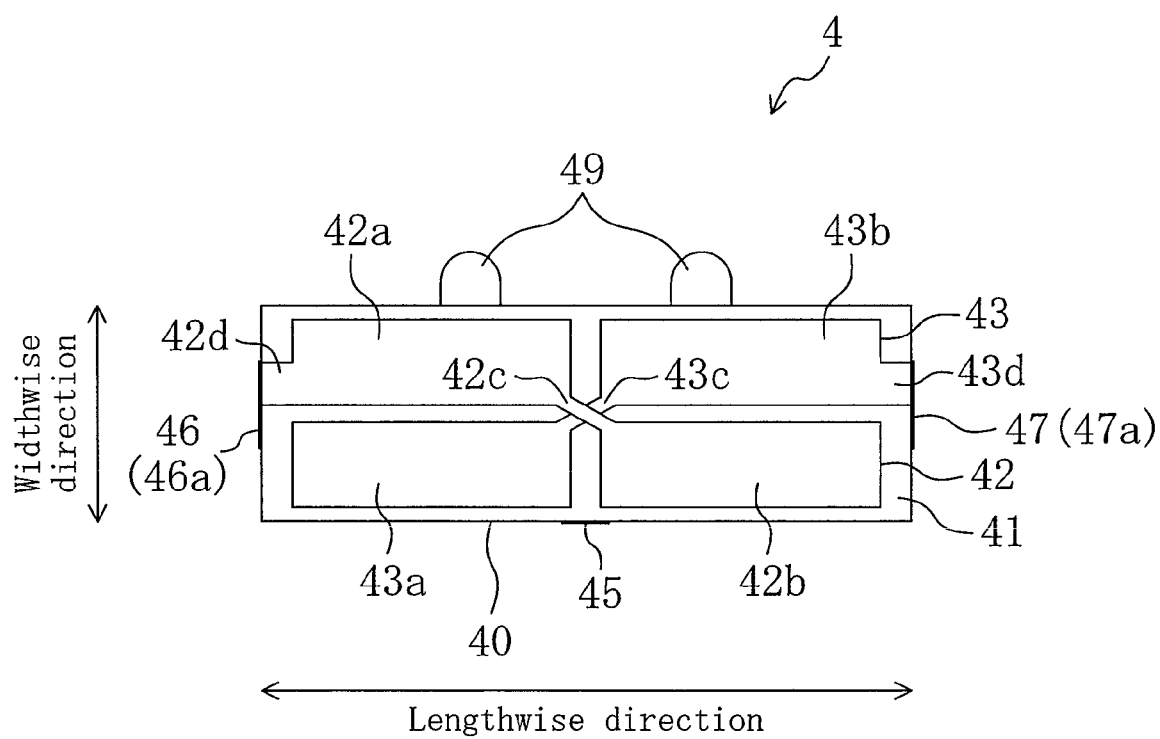
FIG. 5 is a schematic front view illustrating the schematic structure of an actuator body.

Suppose that the principle surface of the piezoelectric layer 41 is divided into quadrants, i.e., two areas in the lengthwise direction and two areas in the widthwise direction. The first feeding electrode layer 42 includes a pair of first electrodes 42*a* and 42*b* respectively formed on one of the pairs of diagonally aligned areas of the principle surface of the corresponding piezoelectric layer 41. A conductive electrode 42*c* connects the first electrodes 42*a* and 42*b* to bring them into conduction as shown in FIG. 5. The first electrodes 42*a* and 42*b* are each a substantially rectangular electrode that overlaps the common electrode layer 44 when viewed in the stacking direction. That is, the first electrode 42*a* (42*b*) is opposed to the common electrode layer 44 with the piezoelectric layer 41 interposed therebetween. One of the first electrodes 42*a* and 42*b*, i.e., the first electrode 42*a*, is provided with a lead electrode 42*d* extending to the external electrode 46*a* of the piezoelectric layer 41.

The second feeding electrode layer 43 includes a pair of second electrodes 43*a* and 43*b* respectively formed on the other pair of diagonally aligned areas of the piezoelectric surface of the corresponding piezoelectric layer 41. A conductive electrode 43*c* connects the second electrodes 43*a* and 43*b* to bring them into conduction. As viewed in the stacking direction represented schematically in FIG. 5, the second electrode 43*a* is provided to be adjacent to the first electrode 42*a* in the widthwise direction and adjacent to the first electrode 42*b* in the lengthwise direction. Similarly, the second electrode 43*b* is provided to be adjacent to the first electrode 42*a* in the lengthwise direction and adjacent to the first electrode 42*b* in the widthwise direction. The second electrodes 43*a* and 43*b* are each a substantially rectangular electrode that overlaps the common electrode layer 44 when viewed in the stacking direction. That is, the second electrode 43*a* (43*b*) is opposed to the common electrode layer 44 with the piezoelectric layer 41 interposed therebetween. One of the second electrodes 43*a* and 43*b*, i.e., the second electrode 43*b*, is provided with a lead electrode 43*d* extending to the external electrode 47*a* of the piezoelectric layer 41.

In the piezoelectric element unit 40 provided by alternately stacking the piezoelectric layers 41 and the internal electrode layers 42, 44, 43 and 44, the external electrodes 45*a* of the piezoelectric layers 41 are aligned in the stacking direction in the middle of one of the long side surfaces of the piezoelectric element unit 40 in the lengthwise direction to function as a single external electrode 45. The lead electrodes 44*a* of the common electrode layers 44 are electrically connected to the external electrode 45. Likewise, the external electrodes 46*a* of the piezoelectric layers 41 are aligned in the stacking direction in the middle of one of the short side surfaces of the piezoelectric element unit 40 in the widthwise direction to function as a single external electrode 46. The lead electrode 42*d* of the first feeding electrode layer 42 is electrically connected to the external electrode 46. Further, the external electrodes 47*a* of the piezoelectric layers 41 are aligned in the stacking direction in the middle of the other short side surface of the piezoelectric element unit 40 in the widthwise direction to function as a single external electrode 47. The lead electrode 43d of the second feeding electrode layer 43 is electrically connected to the external electrode 47. The external electrodes 45, 46 and 47 function as feeding electrodes.

On the other long side surface of the piezoelectric element unit 40, i.e., the long side surface where the external electrodes 45a are not formed, the driver elements 49 are arranged at an interval from each other in the lengthwise direction. The driver elements 49 are preferably arranged at positions inside from the ends of the long side surface in the lengthwise direction by 30 to 35% of the total length of the long side surface. The positions are the antinodes of the second mode of bending vibration of the piezoelectric element unit 40 described later, i.e., positions at which the maximum vibration occurs. The driver elements 49 are columnar elements, at least part of which in contact with the stage 11 has a circular section (specifically, a combination of a columnar element having a semicircle section and a columnar element having a rectangular section), and made of hard material such as ceramic. The driver elements 49 are arranged such that the lengthwise direction of the driver elements 49 is parallel to the thickness direction (stacking direction) of the piezoelectric element unit 40 and the center of the driver elements 49 in the lengthwise direction is aligned with the center of the piezoelectric element unit 40 in the thickness direction.

With the external electrode 45 connected to electrical ground, an AC voltage of a predetermined frequency is applied to the external electrode 46, while an AC voltage having a phase shifted by 90° relative to that of the former AC voltage is applied to the external electrode 47. Accordingly, the AC voltage is applied to the pair of first electrodes 42a and 42b arranged along the diagonal line of the principle surface of the piezoelectric layer 41 and the AC voltage having a phase shifted by 90° from that of the former AC voltage is applied to the pair of second electrodes 43a and 43b arranged along the other diagonal line of the principle surface of the piezoelectric layer 41. This induces longitudinal vibration in the lengthwise direction (so-called stretching vibration) and bending vibration in the widthwise direction (so-called transverse vibration) of the piezoelectric element unit 40, i.e., the actuator body 4.

Figure 6:
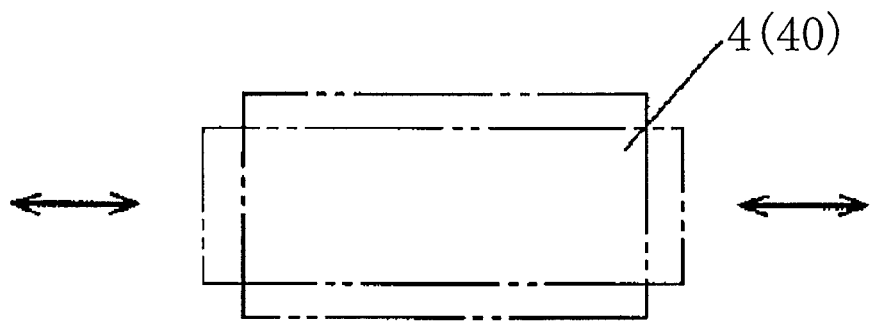
FIG. 6 is a conceptual diagram illustrating the displacement of the actuator body in the first mode of longitudinal vibration in the lengthwise direction.
Figure 7:
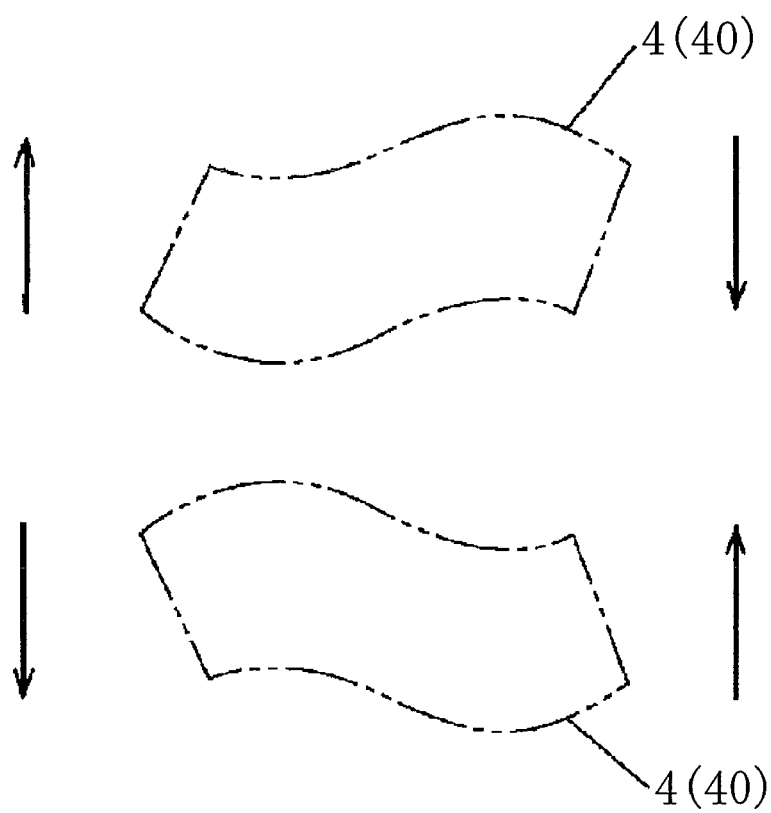
FIG. 7 is a conceptual diagram illustrating the displacement of the actuator body in the second mode of bending vibration.
Figure 8A:
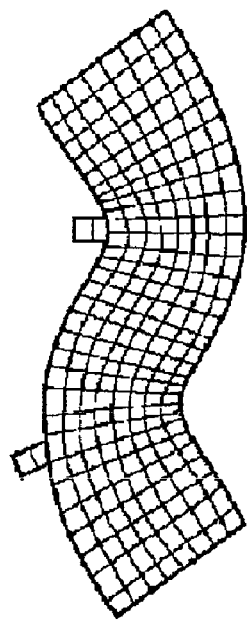
FIGS. 8A to 8D are conceptual diagrams illustrating the movement of the actuator body.
Figure 8B:
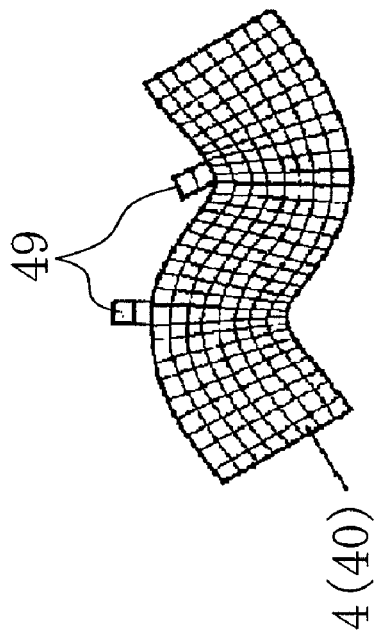
Figure 8C:
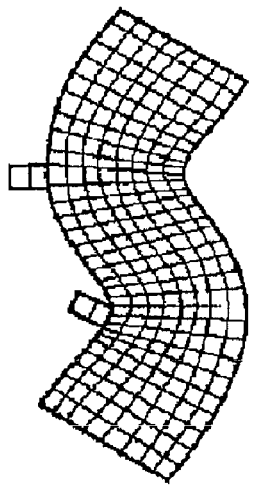
Figure 8D:
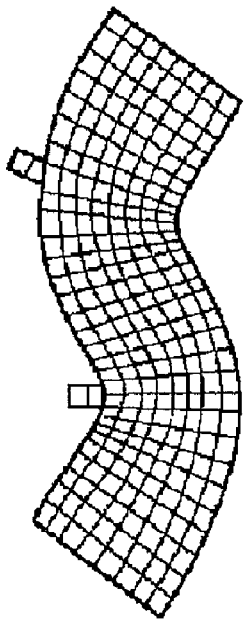

Resonance frequencies of the longitudinal vibration and the bending vibration are determined by the material and the shape of the actuator body 4, i.e., those of the piezoelectric element unit 40. The resonance frequencies are also varied depending on the force supporting the actuator body 4 and positions at which the actuator body 4 is supported. With these facts in mind, the resonance frequencies are adjusted so as to be substantially equal and AC voltages having a frequency close to the adjusted resonance frequency are applied to the external electrodes 46 and 47, respectively, while the phases of the AC voltages are shifted from each other by 90°. For example, if the shape of the piezoelectric element unit 40 is designed such that the first mode of longitudinal vibration (see FIG. 6) and the second mode of bending vibration (see FIG. 7) have the same resonance frequency and the AC voltages having a frequency close to the resonance frequency are applied with their phases shifted from each other by 90° as described above, the first mode of longitudinal vibration and the second mode of bending vibration occur in harmony in the piezoelectric element unit 40. Thus, the shape of the piezoelectric element unit 40 is varied in the order shown in FIGS. 8A to 8D.

As a result, the driver elements 49 of the piezoelectric element unit 40 make a substantially elliptical motion, i.e., circular motion, on a plane parallel to the principle surface of the piezoelectric element unit 40, i.e., a plane including the lengthwise direction and the widthwise direction (a plane parallel to the page surface in FIG. 8).

The case 5 is made of a resin and substantially in the form of a rectangular parallelepiped box corresponding to the shape of the piezoelectric element unit 40. The case 5 has a substantially rectangular main wall 51 parallel to the principle surface of the piezoelectric element unit 40, a first short side wall 52 provided on one short side of the main wall 51 at one end of the main wall 51 in the lengthwise direction (the left short side in FIG. 3), a second short side wall 53 provided on the other short side of the main wall 51 at the other end of the main wall 51 in the lengthwise direction (the right short side in FIG. 3) and a long side wall 54 provided on one long side of the main wall 51 at one end of the main wall 51 in the widthwise direction (the lower long side in FIG. 3). Specifically, the case 5 does not have a wall opposite the main wall 51 and a wall on the other long side of the main wall 51 at the other end of the main wall 51 in the widthwise direction (the upper long side of FIG. 3), i.e., a wall corresponding to the long side surface of the piezoelectric element unit 40 on which the driver elements 49 are formed. The case 5 is opened at a plane perpendicular to the thickness direction of the piezoelectric element unit 40 (normal direction of the main wall 51) and a plane at the other end of the main wall in the widthwise direction.

Figure 9:
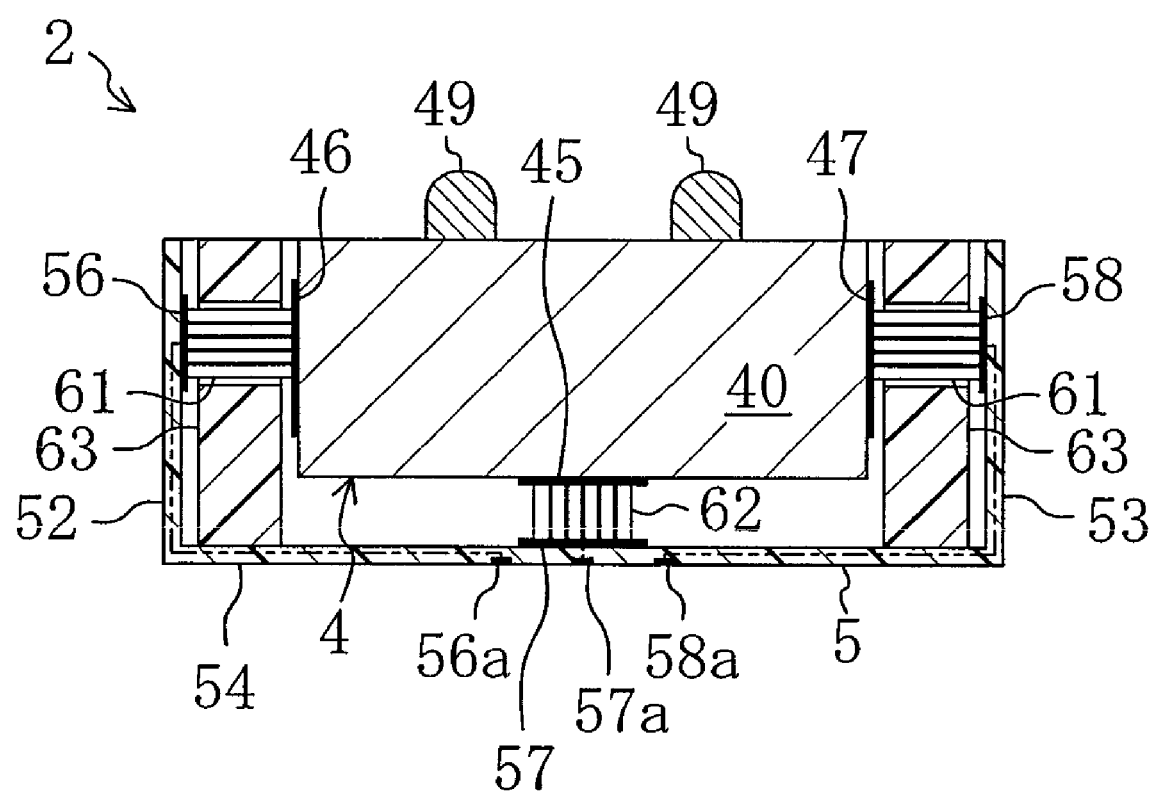
FIG. 9 is a schematic sectional view illustrating the ultrasonic actuator.

As shown in FIG. 9, the case 5 includes electrodes 56, 57 and 58 provided by insert molding. The electrodes 56, 57 and 58 are arranged to be opposed to the external electrodes 46, 45 and 47 of the actuator body 4 contained in the case 5, respectively. Specifically, the electrode 56 is arranged on part of the inner surface of the first short side wall 52 to be opposed to the external electrode 46 of the actuator body 4. The electrode 57 is arranged on part of the inner surface of the long side wall 54 to be opposed to the external electrode 45 of the actuator body 4. The electrode 58 is arranged on part of the inner surface of the second short side wall 53 to be opposed to the external electrode 47 of the actuator body 4. The electrodes 56, 57 and 58 are electrically connected to terminal electrodes 56a, 57a and 58a provided on the outer surface of the long side wall 54, respectively. The case 5 including the electrodes 56, 57 and 58 the terminal electrodes 56a, 57a and 58a may be provided by other method than the insert molding, such as MID (Mold Interconnection Device). The configuration of the electrodes may optionally be changed.

The actuator body 4 is contained in the thus-configured case 5. The actuator body 4 is placed in the case 5 such that one of the principle surfaces of the piezoelectric element unit 40 faces the main wall 51 and one of the long side surfaces of the piezoelectric element unit 40 (the long side surface on which the external electrode 45 is formed) faces the long side wall 54. The driver elements 49 protrude from the case 5 toward the other end in the widthwise direction. One of the support rubbers 61 and one of the stoppers 63 are interposed between one of the short side surfaces of the piezoelectric element unit 40 and the first short side wall 52 of the case 5 and the other support rubber 61 and the other stopper 63 are interposed between the other short side surface of the piezoelectric element unit 40 and the second short side wall 53 of the case 5. The support rubbers 61 function as elastic supports and the stoppers 63 function as abutments.

Figure 10:
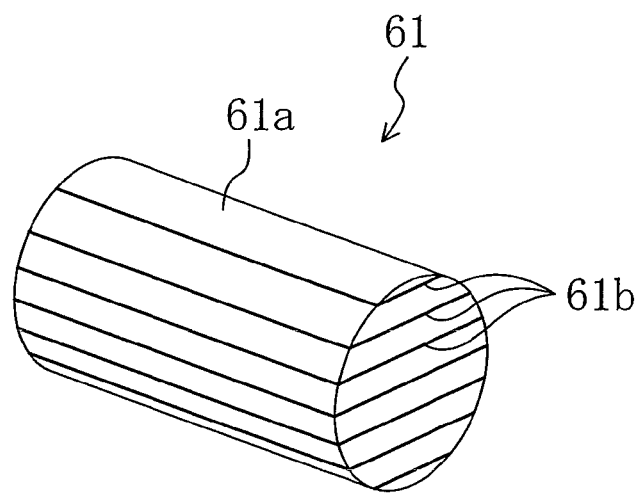
FIG. 10 is a perspective view of a support rubber.

As shown in FIG. 10, each of the support rubbers 61 is made of cylindrical electrically conductive rubber. To be more specific, the support rubber 61 is prepared by providing a plurality of thin metal layers 61b mainly made of silver at intervals in silicone rubber 61a.

Figure 11:
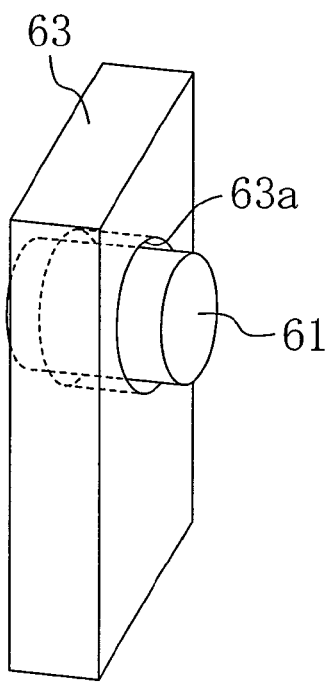
FIG. 11 is a perspective view of the support rubber and a stopper.

Each of the stoppers 63 is a plate-like member as shown in FIG. 11 and has a higher coefficient of elasticity than that of the support rubbers 61 as it is made of highly stiff material (e.g., the same resin as that used for the case 5). Each of the stoppers 63 is provided with an insertion hole 63a in which the support rubber 61 is inserted.

With the support rubbers 61 inserted in the insertion holes 63a of the stoppers 63 to penetrate the stoppers 63, pairs of the support rubber 61 and the stopper 63 are arranged in the gaps between the piezoelectric element unit 40 and the first and second short side walls 52 and 53, respectively, such that the stoppers 63 stand on the long side wall 54 of the case 5.

When the piezoelectric element unit 40 is placed in the case 5 such that the gaps between the piezoelectric element unit 40 and the first and second short side walls 52 and 53 have the same length in the lengthwise direction, the length of the support rubbers 61 in the lengthwise direction of the piezoelectric element unit 40 is greater than the length of the gap. That is, the support rubbers 61 are compressed and deformed in the lengthwise direction when they are placed between the piezoelectric element unit 40 and the case 5. One of the support rubbers 61 is in electrical contact with the external electrode 46 of the actuator body 4 and the electrode 56 of the case 5 to bring them into electrical conduction. The other support rubber 61 is in electrical contact with the external electrode 47 of the actuator body 4 and the electrode 58 of the case 5 to bring them into electrical conduction. Thus, the support rubbers 61 supporting the actuator body 4 also function as feeding terminals for supplying current to the external electrodes 46 and 47 of the actuator body 4.

The support rubbers 61 elastically support the actuator body 4 and inwardly bias the actuator body 4 from both sides of the actuator body 4 in the lengthwise direction. At the same time, the support rubbers 61 bring the piezoelectric element unit 40 and the terminal electrodes 56a and 58a of the case 5 into electrical conduction. Although the support rubbers 61 come into contact with the short side surfaces of the piezoelectric element unit 40 which are antinodes of the longitudinal vibration, the support rubbers 61 can support the piezoelectric element unit 40 without hindering the longitudinal vibration of the piezoelectric element unit 40 because they are elastic bodies.

Further, when the piezoelectric element unit 40 is placed in the case 5 such that the gaps between the piezoelectric element unit 40 and the first and second short side walls 52 and 53 have the same length in the lengthwise direction, the thickness of the stoppers 63 (the length thereof in the lengthwise direction of the piezoelectric element unit 40) is smaller than the length of the gap. That is, when the piezoelectric element unit 40 is placed in the case 5 such that the gaps between the piezoelectric element unit 40 and the first and second short side walls 52 and 53 have the same length in the lengthwise direction, the stoppers 63 are allowed to move between the piezoelectric element unit 40 and the first and second short side walls 52 and 53.

The height of the insertion hole 63a (the position thereof in the widthwise direction of the piezoelectric element unit 40) is determined such that the support rubber 61 inserted in the insertion hole 63a of the stopper 63 comes into contact with the external electrode 46 (47) of the actuator body 4 and the electrode 56 (58) of the case 5 when the stopper 63 stands on the long side wall 54 of the case 5.

Just like the support rubbers 61, the bias rubber 62 is also made of electrically conductive rubber prepared by providing a plurality of thin metal layers mainly made of silver at intervals in silicone rubber. The bias rubber 62 is substantially in the form of a rectangular parallelepiped. The bias rubber 62 is adapted to bias the actuator body 4 in the widthwise direction thereof (i.e., the widthwise direction is the biasing direction). At the same time, the bias rubber 62 is in contact with the external electrode 45 of the piezoelectric element unit 40 and the electrode 57 of the case 5 to bring them into electrical conduction such that the piezoelectric element unit 40 and the terminal electrode 57a are brought into electrical conduction.

With this configuration, feeding to the piezoelectric element unit 40 is achieved by feeding to the terminal electrodes 56a, 57a and 58a formed on the outer surface of the case 5.

In the thus-configured ultrasonic actuator 2, the driver elements 49 are brought into contact with the bottom surface of the stage 11 and the case 5 is fixed to the base (not shown). To be more specific, the ultrasonic actuator 2 is arranged such that the widthwise direction of the piezoelectric element unit 40 is orthogonal to the bottom surface of the stage 11 and the lengthwise direction of the piezoelectric element unit 40 is parallel to the bottom surface of the stage 11 and the guides 12. In other words, the ultrasonic actuator 2 is arranged such that the direction of the bending vibration of the piezoelectric element unit 40 is orthogonal to the bottom surface of the stage 11 and the direction of the longitudinal vibration of the piezoelectric element unit 40 is parallel to the guides 12.

At the same time, the bias rubber 62 is compressed and deformed and the driver elements 49 are biased toward the stage 11 by the elastic force of the bias rubber 62. The biasing force of the ultrasonic actuator 2 on the stage 11 is determined by the elastic force of the bias rubber 62.

The control unit 7 receives an externally applied operation command and applies AC voltages having a frequency corresponding to the operation command to the terminal electrodes 56a and 58a with their phases varied in accordance with the operation command.

As described above, the control unit 7 allows the actuator body 4, or the piezoelectric element unit 40, to generate the longitudinal and bending vibrations in harmony. Then, the driver elements 49 make the circular motion as shown in FIGS. 8A to 8D and the stage 11 moves. More specifically, AC voltages having a frequency slightly higher than a common resonance frequency of the longitudinal and bending vibrations of the piezoelectric element unit 40 are applied to the terminal electrodes 56a and 58a for the purpose of preventing abnormal heat generation by the piezoelectric element unit 40. The AC voltages are applied to the terminal electrodes 56a and 58a with their phases shifted from each other by 90°.

When the piezoelectric element unit 40 generates composite vibration of the longitudinal and bending vibrations, the driver elements 49 make a substantially elliptical motion on the plane including the lengthwise and widthwise directions of the piezoelectric element unit 40. The driver elements 49 periodically come in and out of contact with the stage 11 to apply a driving force to the stage 11 in the lengthwise direction of the piezoelectric element unit 40 by friction. Therefore, the stage 11 moves along the guides 12. Depending on the degree of the circular motion, the driver elements 49 do not come out of contact with the stage 11 but repeatedly increase and decrease the friction against the stage 11. The lengthwise direction of the piezoelectric element unit 40 (the extending direction of the guides 12) corresponds to the driving direction in which the driver elements 49 outputs the driving force.

Figure 12A:
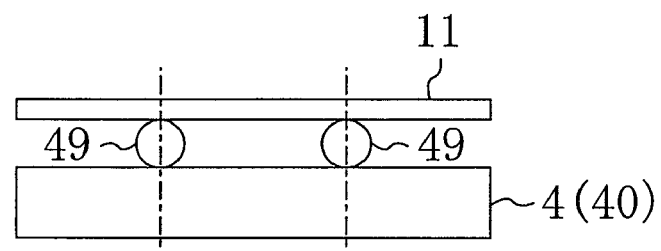
FIGS. 12A to 12C are conceptual diagrams illustrating how a stage is driven by the ultrasonic actuator.
Figure 12B:
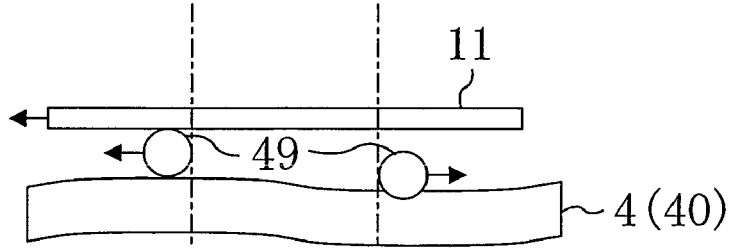

Specifically, when the piezoelectric element unit 40 stretches in the lengthwise direction (the direction of the longitudinal vibration), one of the driver elements 49 (e.g., left one in FIG. 12) moves in the lengthwise direction to pass closer to the stage 11 than to the piezoelectric element unit 40 in the widthwise direction (the direction of the bending vibration) as shown in FIG. 12B and applies increased friction against the stage 11. With this friction, the stage 11 is displaced toward the moving direction of the one of the driver elements 49 in the lengthwise direction (to the left in FIG. 12). At the same time, the other driver element 49 (right one in FIG. 12) moves in the lengthwise direction opposite from the moving direction of the former driver element 49 to pass closer to the piezoelectric element unit 40 than to the stage 11 in the widthwise direction (to be spaced from the stage 11). Therefore, the friction between the latter driver element 49 and the stage 11 is reduced or zero. Thus, the latter driver element 49 has little influence on the displacement of the stage 11.

Figure 12C:
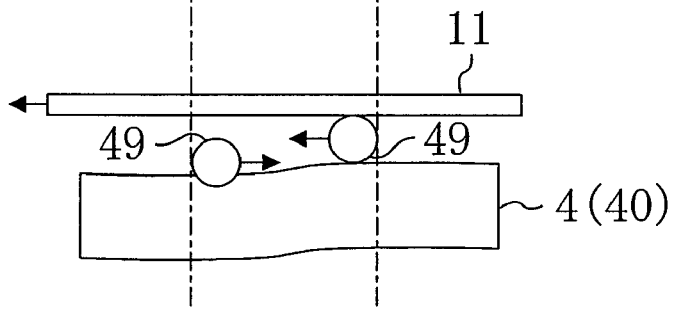

In the case where the piezoelectric element unit 40 contracts in the lengthwise direction, the latter driver element 49 (right one in FIG. 12) moves in the lengthwise direction to pass closer to the stage 11 than to the piezoelectric element unit 40 in the widthwise direction as shown in FIG. 12C and applies increased friction against the stage 11. With this friction, the stage 11 is displaced toward the moving direction of the latter driver element 49 in the lengthwise direction (to the left in FIG. 12). At the same time, the former driver element 49 (left one in FIG. 12) moves in the lengthwise direction opposite from the moving direction of the latter driver element 49 to pass closer to the piezoelectric element unit 40 than to the stage 11 in the widthwise direction. Therefore, the friction between the former driver element 49 and the stage 11 is reduced or zero. Thus, the former driver element 49 has little influence on the displacement of the stage 11. The direction of the displacement in this case is the same as the moving direction of the stage 11 driven by the former driver element 49 when the piezoelectric element unit 40 is stretched.

In this manner, the two driver elements 49 alternately cause the stage 11 to move in the same direction while their phases are shifted from each other by 180°. If the AC voltages with their phases shifted from each other by −90° are applied to the terminal electrodes 56a and 58a, the driver elements 49 deliver the driving force in the opposite direction such that the stage 11 moves in the opposite direction.

The travel distance, traveling speed and traveling acceleration of the stage 11 are adjusted by controlling at least one of the voltage value, the frequency and the feeding period of the AC voltages applied to the terminal electrodes 56a and 58a. Alternately, the adjustment is carried out by changing the value of phase difference between the AC voltages applied to the terminal electrodes 56a and 58a.

When the piezoelectric element unit 40 is vibrated to apply the driving force from the driver elements 49 to the stage 11, the piezoelectric element unit 40 receives a reaction force from the stage 11 through the driver elements 49. The magnitude of the reaction force is determined by the magnitude of the driving force output from the driver elements 49, i.e., the degree of the circular motion of the driver elements 49, the magnitude of the biasing force applied by the bias rubber 62 for biasing the driver elements 49 to the stage 11, a coefficient of friction between the driver elements 49 and the stage 11, etc.

Due to the reaction force from the stage 11, the piezoelectric element unit 40 is displaced in the direction opposite the driving direction in which the driver elements 49 output the driving force, or the moving direction of the stage 11.

Figure 13:
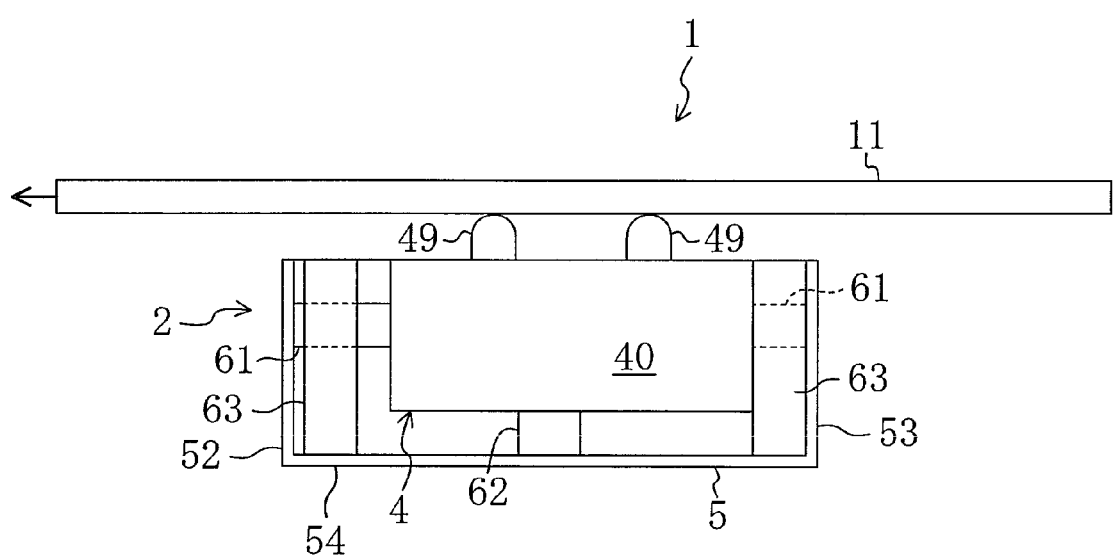
FIG. 13 is a schematic front view illustrating the drive unit with the actuator body displaced in the other driving direction.

For example, as shown in FIG. 13, when the stage 11 is driven in a driving direction (e.g., to the left in FIG. 13), the piezoelectric element unit 40 is displaced in a direction opposite the driving direction (e.g., to the right in FIG. 13) as it receives the reaction force. When the piezoelectric element unit 40 is thus displaced in the opposite direction, one of the support rubbers 61 provided at the side of the piezoelectric element unit 40 facing the opposite direction is compressed and deformed. Due to the compressive deformation, the support rubber 61 exerts an increased elastic force. As a result, the piezoelectric element unit 40 is displaced in the opposite direction until the elastic force of the support rubber 61 and the reaction force of the stage 11 are brought into balance. When the reaction force of the stage 11 is small, it is received by the elastic force of the support rubber 61 provided at the side of the piezoelectric element unit 40 facing the opposite direction and driving force in the driving direction is applied to the stage 11.

When the reaction force of the stage 11 is large, the piezoelectric element unit 40 displaced in the opposite direction by the reaction force of the stage 11 is received by the stopper 63 as shown in FIG. 13. As a result, the driving force of the piezoelectric element unit 40 is applied to the stage 11 as the stopper 63 serves as a point of support. Specifically, the piezoelectric element unit 40 is displaced in the opposite direction due to the reaction force of the stage 11 and the gap between the short side surface of the piezoelectric element unit 40 and the second short side wall 53 becomes equal to the thickness of the stopper 63. Then, the piezoelectric element unit 40, the stopper 63 and the second short side wall 53 come into contact side by side in this order. Therefore, further displacement of the piezoelectric element unit 40 in the opposite direction is limited. That is, the reaction force equal to or greater than the elastic force which deforms the support rubber 61 down to the thickness of the stopper 63 is received by the stopper 63. The term "limit" does not mean that the displacement in the opposite direction is completely prohibited, but it means that the displacement in the opposite direction is restrained.

At the same time, the support rubber 61 provided at the side of the piezoelectric element unit 40 facing the one driving direction (e.g., to the left in FIG. 13), which is compressed and deformed between the side of the piezoelectric element unit 40 and the short side wall 52 in the initial state, stretches as the piezoelectric element unit 40 is displaced in the opposite direction (e.g., to the right in FIG. 13). The natural length of this support rubber 61 is determined such that the support rubber 61 remains compressed and deformed even if it stretches upon the displacement of the piezoelectric element unit 40. Specifically, even when the piezoelectric element unit 40 is brought into contact with the stopper 63 and the second short side wall 53 side by side on the opposite side in the lengthwise direction, the natural length of the support rubber 61 is larger than the gap between the piezoelectric element unit 40 and the first short side wall 52 on the other side in the lengthwise direction. As a result, even when the piezoelectric element unit 40 is displaced in the opposite direction such that the piezoelectric element unit 40, the stopper 63 and the second short side wall 53 are brought into contact side by side, the support rubber 61 provided at the other side in the lengthwise direction keeps the contact between the external electrode 46 of the piezoelectric element unit 40 and the electrode 56 on the first short side wall 52. Thus, the electrical conduction between the electrodes 46 and 56 is maintained.

The same phenomenon occurs when the stage 11 is driven in the other driving direction (e.g., to the right in FIG. 13).

As described above, when the reaction force of the stage 11 is small, the piezoelectric element unit 40 is elastically supported by the support rubbers 61. On the other hand, when the reaction force of the stage 11 is larger than a predetermined value as determined by the elasticity characteristics of the support rubbers 61, for example, the piezoelectric element unit 40 is supported by the stoppers 63 with high stiffness. Therefore, the driving force of the piezoelectric element unit 40 is efficiently transmitted to the stage 11 through the driver elements 49 such that the stage 11 is driven. When one of the sides of the piezoelectric element unit 40 facing the direction opposite the driving direction is supported by the stopper 63, the other side of the piezoelectric element unit 40 facing the driving direction is elastically supported by the support rubber 61. Therefore, the vibration of the piezoelectric element unit 40 is not hindered.

According to the above-described embodiment, the support rubbers 61 elastically support the piezoelectric element unit 40 along the lengthwise direction of the piezoelectric element unit 40 from both sides, while the stoppers 63 are provided at the both sides of the piezoelectric element unit 40 in the lengthwise direction to limit the displacement of the piezoelectric element unit 40 in the lengthwise direction. Therefore, the piezoelectric element unit 40 is elastically supported by the support rubbers 61 without hindering the vibration thereof. Further, when the reaction force of the stage 11 is large, the reaction force is received by the stoppers 63 such that the driving force of the piezoelectric element unit 40 is surely transmitted to the stage 11.

In this case, what the stopper 63 supports with high stiffness is only one of the short side surfaces on one side of the piezoelectric element unit 40 in the lengthwise direction which serves as a point of support for applying the driving force to the stage 11. The other short side surface on the other side of the piezoelectric element unit 40 in the lengthwise direction is elastically supported by the support rubber 61. Therefore, although the displacement of the piezoelectric element unit 40 to the one side in the lengthwise direction is limited, the vibration in the lengthwise direction is not hindered. Thus, the longitudinal vibration in the lengthwise direction and the bending vibration in the widthwise direction are generated in harmony. As a result, the driver elements 49 output a desired driving force substantially without limitation.

In the above-described embodiment, the stoppers 63 are made of material having a higher coefficient of elasticity than that of the support rubbers 61. Therefore, the reaction force of the stage 11 is received by an increased elastic force.

According to the embodiment, the support rubbers 61 are made of conductive rubber such that they elastically support the piezoelectric element unit 40 on the one hand and realize the electrical conduction between the piezoelectric element unit 40 and the terminal electrodes 56a and 58a of the case 5 on the other hand. Even if the piezoelectric element unit 40 is displaced in the direction opposite the driving direction due to the reaction force of the stage 11, the displacement in the opposite direction is limited by the stopper 63. Therefore, the gap between the side surface of the piezoelectric element unit 40 facing the driving direction and the case 5 is also limited. This makes it possible to prevent the gap between the piezoelectric element unit 40 and the case 5 from becoming too large and prevent the support rubber 61 from coming off the external electrode 46 (47) of the piezoelectric element unit 40 or the electrode 56 (58) of the case 5 and breaking the electrical conduction therebetween. Thus, the electrical conduction between the piezoelectric element unit 40 and the terminal electrodes 56a and 58a of the case 5 is ensured.

The height of the insertion hole 63a (the position thereof in the widthwise direction of the piezoelectric element unit 40) is determined such that the support rubber 61 inserted in the insertion hole 63a of the stopper 63 comes into contact with the external electrode 46 (47) of the piezoelectric element unit 40 and the electrode 56 (58) of the case 5 when the stopper 63 stands on the long side wall 54 of the case 5. In this manner, the position of the support rubber 61 is easily determined and the vibration actuator is assembled with greater ease. This configuration is particularly effective when the support rubbers 61 are made of conductive rubber such that the external electrodes 46 and 47 of the piezoelectric element unit 40 and the electrodes 56 and 58 of the case 5 are brought into electrical conduction through the support rubbers 61, respectively, as described in the embodiment because the electrical conduction is surely realized by the support rubbers 61.

Other Embodiments

The vibration actuator of the above-described embodiment may be configured as follows.

The stoppers 63 according to the embodiment are made of the same resin as that used for the case 5. However, the material is not limited thereto and the stoppers may be made of an elastic body such as silicone rubber. In this case, the piezoelectric element unit 40 is elastically supported only by the support rubbers 61 until the piezoelectric element unit 40 comes into contact with the stoppers 63. After the piezoelectric element unit 40 comes into contact with the stoppers 63, the piezoelectric element unit 40 is elastically supported by both of the stoppers 63 and the support rubbers 61. That is, after the piezoelectric element unit 40 comes into contact with the stoppers 63, the piezoelectric element unit 40 is elastically supported by the stoppers 63 and the support rubbers 61 in a parallel manner and the piezoelectric element unit 40 is supported by a greater elastic force than that exerted only by the support rubbers 61. As a result, a support structure which is able to elastically support the piezoelectric element unit 40 without hindering its vibration, bear the reaction force of the stage 11 and output a sufficient driving force to the stage 11 is realized. In this case, the stoppers 63 are preferably made of material having a higher coefficient of elasticity than that of the support rubbers 61 elastically supporting the piezoelectric element unit 40 or the actuator body 4 in the driving direction. By so doing, the reaction force of the stage 11 is received by the greater elastic force.

The shapes of the support rubbers 61 and the stoppers 63 and how they are arranged are not limited to those described in the embodiment. That is, there is no need of inserting the support rubbers 61 in the insertion holes 63a formed in the stoppers 63. Instead, they may be shaped and arranged in any way as long as the support rubbers 61 elastically support the piezoelectric element unit 40 and the support rubbers 61 and the stoppers 63 come into contact with the piezoelectric element unit 40 to limit the displacement of the piezoelectric element unit 40 in the driving direction after the piezoelectric element unit 40 is displaced to some extent. However, according to the configuration of the embodiment, the positions of the support rubbers 61 between the piezoelectric element unit 40 and the case 5 are determined by merely inserting the support rubbers 61 in the insertion holes 63a formed in the stoppers 63. Thus, the support rubbers 61 are surely brought into contact with the external electrode 46 (47) of the piezoelectric element unit 40 and the electrode 56 (58) of the case 5.

Figure 16:
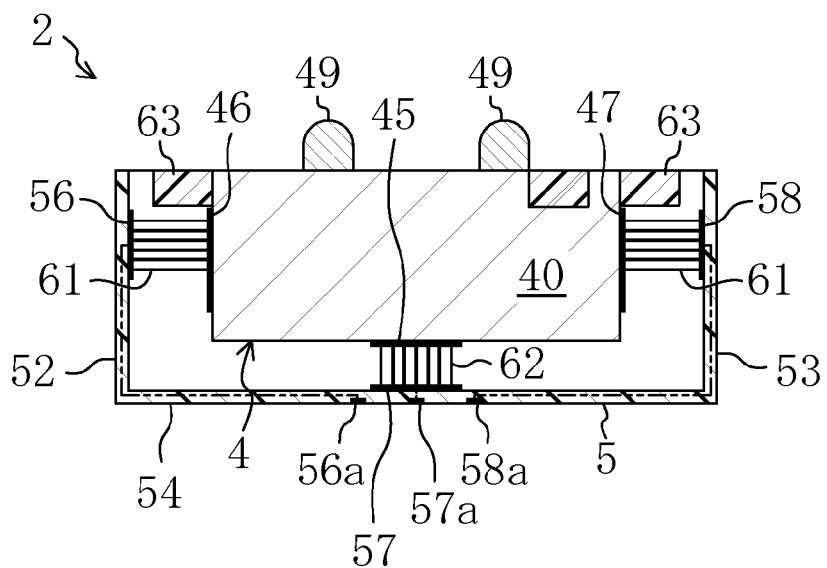
FIG. 16 is a schematic sectional view illustrating another embodiment of an ultrasonic actuator.
Figure 17:
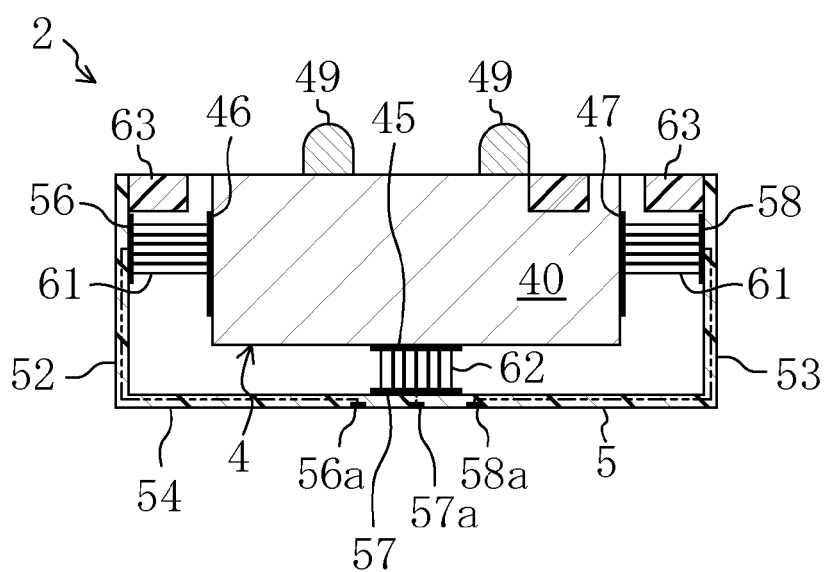
FIG. 17 is a schematic sectional view illustrating another embodiment of an ultrasonic actuator.

The stoppers 63 of the above-described embodiment are configured as separate members from the case 5 and the piezoelectric element unit 40. However, the present invention is not limited thereto. The stoppers 63 and the case 5 may be integrated into one piece or the stoppers 63 and the piezoelectric element unit 40 may be integrated into one piece. For example, as an example of the stoppers 63 and the case 5 integrated in one piece, protrusions extending toward the piezoelectric element unit 40 may be provided in parts of the case 5 facing the short side surfaces of the piezoelectric element unit 40 and not in contact with the support rubbers 61 such that the protrusions function as the stoppers (abutments), as shown in FIG. 17. In this example, the piezoelectric element unit 40 can be displaced in the direction opposite the driving direction until it comes into contact with the protrusion while it is elastically supported by the support rubbers 61. Further, when the piezoelectric element unit 40 is displaced in the opposite direction to such an extent that it comes into contact with the protrusion, the protrusion limits further displacement of the piezoelectric element unit 40 in the opposite direction. Alternatively, holes may be formed in the first and second short side walls of the case 5 to have closed bottoms and openings toward the inside of the case 5 for installing the support rubbers 61 therein. In such a case, the piezoelectric element unit 40 can be displaced in the opposite direction until it comes to contact with the first or second short side wall 52 or 53 while it is elastically supported by the support rubbers 61. Further, when the piezoelectric element unit 40 is displaced in the opposite direction to such an extent that it comes into contact with the first or second short side wall 52 or 53, the first or second short side wall 52 or 53 limits further displacement of the piezoelectric element unit 40 in the opposite direction. Likewise, as an example of the stoppers 63 and the piezoelectric element unit 40 integrated in one piece, projections extending toward the first or second short side wall 52 or 53 of the case 5 are provided in parts of the short side surfaces of the piezoelectric element unit 40 not in contact with the support rubbers 61 such that the protrusions function as stoppers, as shown in FIG. 16. In this example, the piezoelectric element unit 40 can be displaced in the opposite direction until the protrusion comes into contact with the first or second short side wall 52 or 53 while the piezoelectric element unit 40 is elastically supported by the support rubbers 61. Further, when the piezoelectric element unit 40 is displaced in the opposite direction to such an extent that the protrusion of the piezoelectric element unit 40 comes into contact with the first or second short side wall 52 or 53, the protrusion limits further displacement of the piezoelectric element unit 40 in the opposite direction. Thus, the abutment may be configured in any way as long as it permits some displacement of the piezoelectric element unit 40 in the opposite direction while the support rubbers 61 elastically support the piezoelectric element unit 40 and limits the displacement of the piezoelectric element unit 40 in the opposite direction after the displacement reaches the predetermined value.

The support rubbers 61 of the embodiment are cylindrical and made of silicone rubber including the thin metal layers therein. However, the present invention is not limited thereto. For example, the support rubbers 61 may be made of conductive rubber prepared by mixing metal particles in an elastic body such as silicone rubber. Further, the shape of the support rubbers 61 is not limited to the cylindrical shape and any other shapes may be applicable, such as a rectangular parallelepiped.

According to the above-described embodiments, the ultrasonic actuator 2 is configured such that the actuator body 4 vibrates in the first mode of longitudinal vibration in the lengthwise direction and the second mode of bending vibration in harmony. However, the present invention is not limited thereto. The ultrasonic actuator 2 may generate other kinds of vibrations and other modes. The ultrasonic actuator 2 may be configured in any way as long as it functions as a vibration actuator in which the actuator body 4 vibrates to deliver the driving force caused by the friction between the driver elements 49 and the stage 11.

Figure 14:
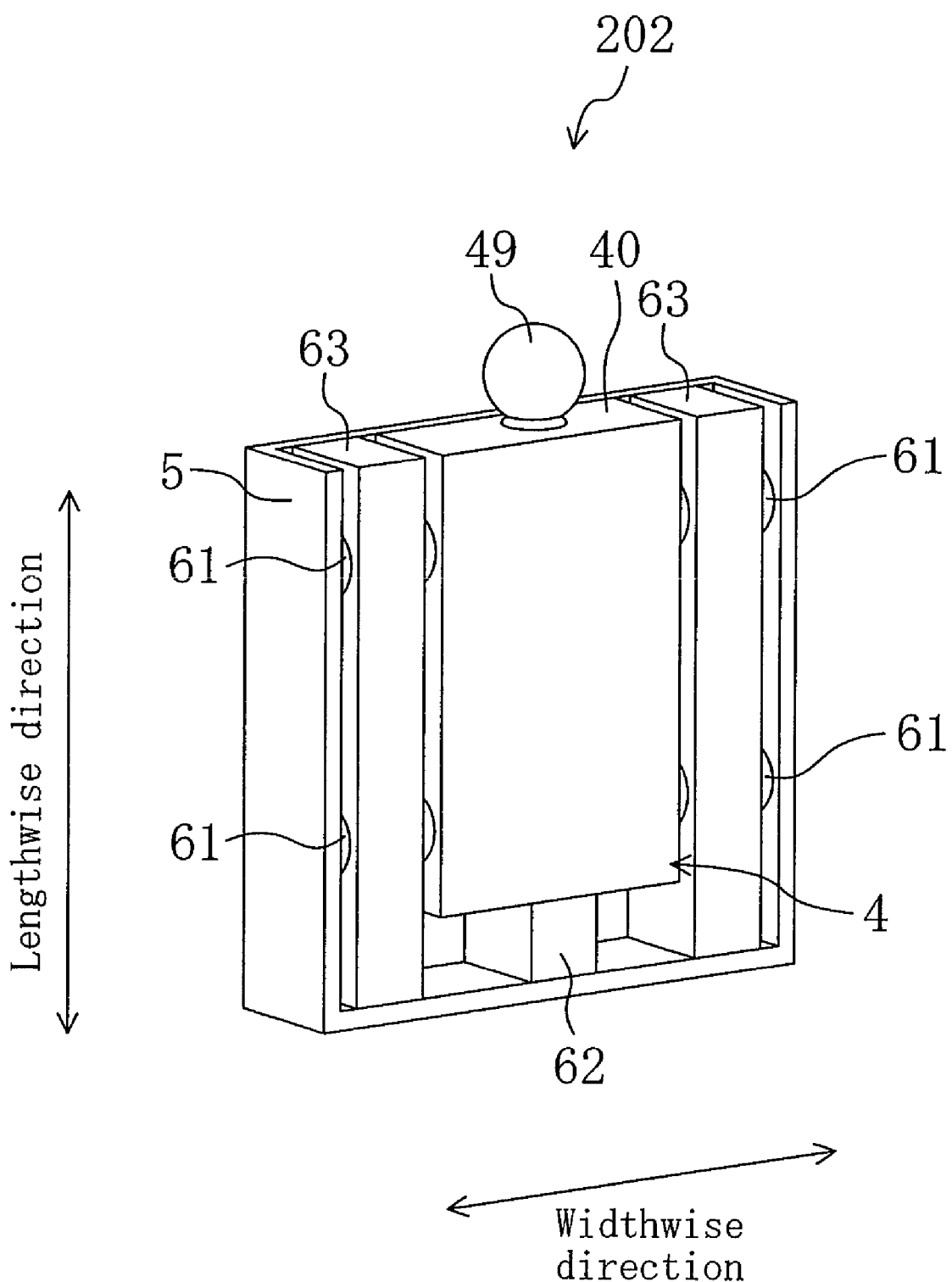
FIG. 14 is a perspective view of another embodiment of an ultrasonic actuator.

The configuration of the ultrasonic actuator 2 is not limited to that described above. For example, instead of feeding the piezoelectric element unit 40 via the support rubbers 61 and the bias rubber 62, leads may be connected to the piezoelectric element unit 40 to feed the piezoelectric element unit 40. The node of the vibration of the piezoelectric element unit 40 may be supported by an inelastic member. It is also possible to adopt an ultrasonic actuator 202 as shown in FIG. 14 in which a single driver element 49 is provided on one of the short side surfaces of the piezoelectric element unit 40. With this configuration, the driver element 49 makes a circular motion as the piezoelectric element unit 40 generates the composite vibration of the first mode of longitudinal vibration in the lengthwise direction and the second mode of bending vibration such that the stage 11 moves in the predetermined moving direction (parallel to the widthwise direction) via the friction between the driver element 49 and the stage 11. Further, in place of the piezoelectric element unit 40 which functions as the actuator body 4, a structure prepared by adhering a piezoelectric element on a metal substrate or a resonator made of metal with a piezoelectric element sandwiched between may be used. In such a case, the resonator including the piezoelectric element functions as the actuator body.

Figure 15:
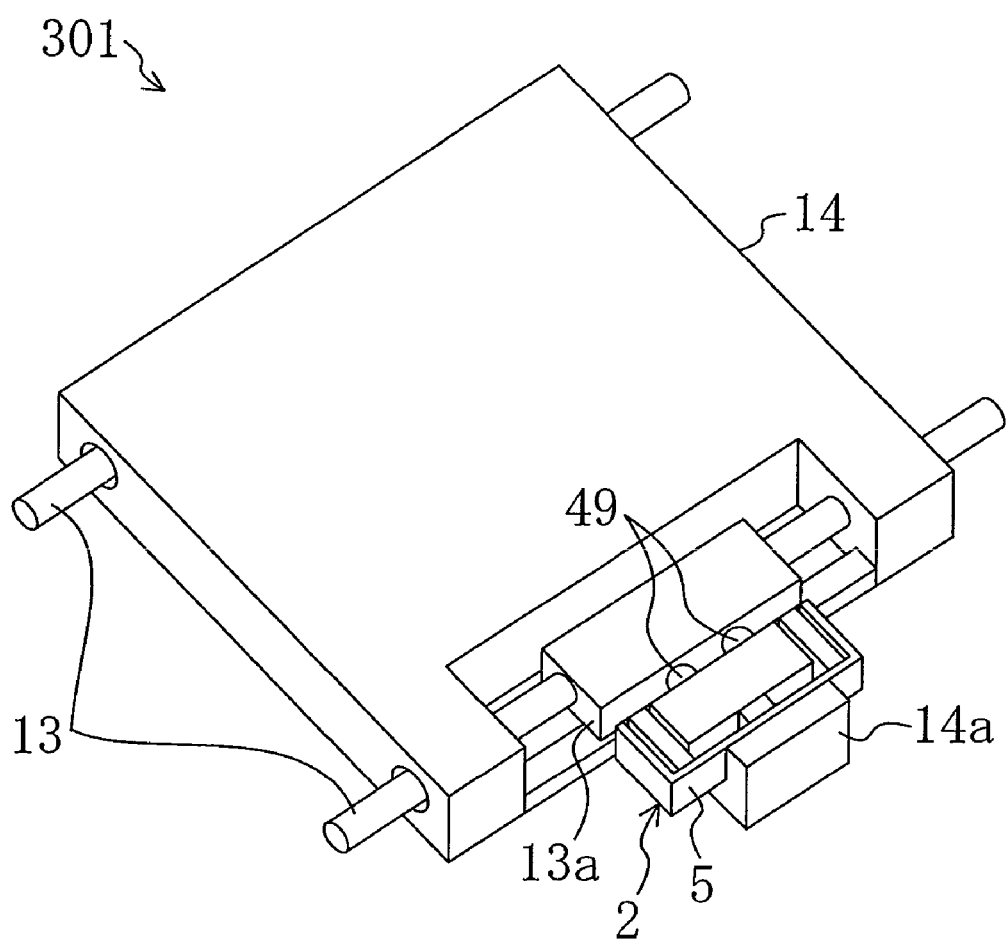
FIG. 15 is a perspective view of another embodiment of a drive unit.

In the above-described embodiments, the ultrasonic actuator 2 is fixed to the base and the driver elements 49 are brought into contact with the movable stage 11 and the ultrasonic actuator 2 is operated to drive the stage 11. However, as shown in FIG. 15, the ultrasonic actuator 2 may be fixed to the stage. Specifically, a drive unit 301 includes guides 13 fixed in parallel with each other on a base, a stage 14 slidably attached to the guides 13 and an ultrasonic actuator 2. One of the guides 13 is provided with an abutment 13a fixed to the guide 13. The stage 14 is provided with an actuator mount 14a. A case 5 is mounted on the actuator mount 14a of the stage 14 such that driver elements 49 of the ultrasonic actuator 2 are in contact with the abutment 13a of the guide 13. When the ultrasonic actuator 2 is actuated in this state, the driver elements 49 deliver the driving force to the abutment 13a. Then, the ultrasonic actuator 2 vibrates relatively to the abutment 13a in the lengthwise direction of the guides 13 because the abutment 13a is fixed. As a result, the stage 14 joined with the case 5 via the actuator mount 14a is driven in the lengthwise direction of the guides 13.

It should be noted that the present invention is not limited to the above embodiment and various modifications are possible within the spirit and essential features of the present invention. The above embodiment shall be interpreted as illustrative and not in a limiting sense. The scope of the present invention is specified only by the following claims and the description of the specification is not limitative at all. Further, it is also to be understood that all the changes and modifications made within the scope of the claims fall within the scope of the present invention.

As described above, the present invention is useful for a vibration actuator in which an actuator body generating a plurality of vibrations of different vibration directions is elastically supported along the driving direction.

What is claimed is:

1. A vibration actuator comprising:
   an actuator body using a piezoelectric element and generating a plurality of vibrations of different vibration directions;
   a driver element provided in the actuator body and operated in accordance with the vibration of the actuator body to output a driving force in a predetermined driving direction;
   a case containing the actuator body;

at least one elastic support provided between the actuator body and the case to elastically support the actuator body along the driving direction with respect to the case; and at least one abutment provided between the actuator body and the case which comes into contact with at least one of the actuator body and the case when the actuator body is displaced in a direction opposite the driving direction such that the displacement of the actuator body in the direction opposite the driving direction is limited.

2. The vibration actuator of claim 1, wherein the abutment has a higher coefficient of elasticity than that of the elastic support.

3. The vibration actuator of claim 1, wherein
the actuator body is provided with a feeding electrode electrically connected to the piezoelectric element and
the elastic support is made of conductive rubber and in contact with the feeding electrode to elastically support the actuator body and function as a feeding terminal for supplying current to the feeding electrode.

4. The vibration actuator of claim 1, wherein
the at least one elastic support includes an elastic support provided at each side of the actuator body, one of the sides facing the driving direction and the other side facing the direction opposite the driving direction, to support the actuator body along the driving direction from the both sides and
the at least one abutment includes an abutment provided at each side of the actuator body.

5. The vibration actuator of claim 4, wherein
when the actuator body displaced in the direction opposite the driving direction comes into contact with the abutment at the other side thereof facing the direction opposite the driving direction such that the displacement in the direction opposite the driving direction is limited, the actuator body is elastically supported by the elastic support at the one side thereof facing the driving direction.

6. The vibration actuator of claim 1, wherein
the actuator body is shaped to have a lengthwise direction, a widthwise direction and a thickness direction orthogonal to the lengthwise and widthwise directions and
the plurality of vibrations include longitudinal vibration in the lengthwise direction of the actuator body and bending vibration in the widthwise direction of the actuator body.

7. The vibration actuator of claim 6, wherein the driving directions correspond to the lengthwise direction of the actuator body.

8. The vibration actuator of claim 6, wherein the driving directions correspond to the widthwise direction of the actuator body.

9. The vibration actuator of claim 1, wherein the at least one abutment comprises a stopper separate from the actuator body and the case and positioned in a space between the actuator body and the case.

10. The vibration actuator of claim 1, wherein the at least one abutment comprises at least one protrusion on at least one of the actuator body and the case.

11. The vibration actuator of claim 1, wherein the at least one abutment comprises a surface of at least one of the actuator body and the case, the surface being positioned within a space between the actuator body and the case as defined by the at least one elastic support.

12. The vibration actuator of claim 2, wherein
the actuator body is provided with a feeding electrode electrically connected to the piezoelectric element and
the elastic support is made of conductive rubber and in contact with the feeding electrode to elastically support the actuator body and function as a feeding terminal for supplying current to the feeding electrode.

13. The vibration actuator of claim 2, wherein
the at least one elastic support includes an elastic support provided at each side of the actuator body, one of the sides facing the driving direction and the other side facing the direction opposite the driving direction, to support the actuator body along the driving direction from the both sides and
the at least one abutment includes an abutment provided at each side of the actuator body.

14. The vibration actuator of claim 3, wherein
the at least one elastic support includes an elastic support provided at each side of the actuator body, one of the sides facing the driving direction and the other side facing the direction opposite the driving direction, to support the actuator body along the driving direction from the both sides and
the at least one abutment includes an abutment provided at each side of the actuator body.

15. The vibration actuator of claim 2, wherein
the actuator body is shaped to have a lengthwise direction, a widthwise direction and a thickness direction orthogonal to the lengthwise and widthwise directions and
the plurality of vibrations include longitudinal vibration in the lengthwise direction of the actuator body and bending vibration in the widthwise direction of the actuator body.

16. The vibration actuator of claim 3, wherein
the actuator body is shaped to have a lengthwise direction, a widthwise direction and a thickness direction orthogonal to the lengthwise and widthwise directions and
the plurality of vibrations include longitudinal vibration in the lengthwise direction of the actuator body and bending vibration in the widthwise direction of the actuator body.

17. The vibration actuator of claim 4, wherein
the actuator body is shaped to have a lengthwise direction, a widthwise direction and a thickness direction orthogonal to the lengthwise and widthwise directions and
the plurality of vibrations include longitudinal vibration in the lengthwise direction of the actuator body and bending vibration in the widthwise direction of the actuator body.

18. The vibration actuator of claim 5, wherein
the actuator body is shaped to have a lengthwise direction, a widthwise direction and a thickness direction orthogonal to the lengthwise and widthwise directions and
the plurality of vibrations include longitudinal vibration in the lengthwise direction of the actuator body and bending vibration in the widthwise direction of the actuator body.

* * * * *